US008749092B2

United States Patent
Hantschel et al.

(10) Patent No.: US 8,749,092 B2
(45) Date of Patent: Jun. 10, 2014

(54) APPARATUS FOR PROVIDING AN INPUT DC VOLTAGE FOR A PHOTOVOLTAIC INVERTER AND PHOTOVOLTAIC SYSTEM INCLUDING SUCH APPARATUS

(75) Inventors: Jochen Hantschel, Dettingen A. D. Erms (DE); Felix Martin, Tübingen (DE)

(73) Assignee: Refu Elektronik GmbH, Metzingen (DE)

( * ) Notice: Subject to any disclaimer, the term of this patent is extended or adjusted under 35 U.S.C. 154(b) by 509 days.

(21) Appl. No.: 13/068,753

(22) Filed: May 19, 2011

(65) Prior Publication Data

US 2012/0007429 A1    Jan. 12, 2012

(30) Foreign Application Priority Data

Jul. 9, 2010    (DE) .......................... 10 2010 026 778

(51) Int. Cl.
 *H02J 3/38*    (2006.01)
(52) U.S. Cl.
 USPC ........................................................... 307/19
(58) Field of Classification Search
 USPC ........................................................ 307/19
 See application file for complete search history.

(56) References Cited

U.S. PATENT DOCUMENTS

| 8,558,102 | B2 * | 10/2013 | Croft et al. ..................... 136/244 |
| 2008/0266919 | A1 * | 10/2008 | Mallwitz ....................... 363/124 |
| 2009/0032082 | A1 | 2/2009 | Gilmore et al. |

FOREIGN PATENT DOCUMENTS

DE    10 2005 024 465 B4    7/2010

* cited by examiner

*Primary Examiner* — Robert L. Deberadinis
(74) *Attorney, Agent, or Firm* — R. S. Lombard; K. Bach (57) ABSTRACT

A photovoltaic system includes a first and a second photovoltaic generator (9, 11) which delivers electric energy, an inverter (4) which can be coupled to the PV-generators (9, 11) for converting electric energy of the PV generators (9, 11) to output AC energy, and a switchable coupling arrangement (3) for coupling the PV generators (9, 11) to each other and to the inverter (4). The coupling arrangement (3) is arranged functionally between the PV generators (9, 11) and the inverter (4) and designed to connect the PV generators selectively either in a series circuit arrangement or a parallel circuit arrangement to the inverter (4). The PV system (1) can therefore expediently be operated with an intermediate circuit voltage which is higher than the maximum voltage of one PV generator for achieving improved efficiency whereas it can be switched to a lower intermediate circuit voltage when necessary, for example, in case of a ground connection fault, to maintain predetermined voltage limits.

14 Claims, 4 Drawing Sheets

APPARATUS FOR PROVIDING AN INPUT DC VOLTAGE FOR A PHOTOVOLTAIC INVERTER AND PHOTOVOLTAIC SYSTEM INCLUDING SUCH APPARATUS

CROSS-REFERENCE TO RELATED APPLICATION

This application claims the priority of German Application No. 10 2010 026 778.3 filed Jul. 9, 2010.

BACKGROUND OF THE INVENTION

The present invention relates generally to photovoltaic systems with an inverter for transforming an electric DC voltage into at least one AC voltage. The invention resides in particular in an apparatus for providing an input DC voltage for a photovoltaic inverter, a photovoltaic system including such an apparatus and a method for operating the photovoltaic system.

Photovoltaic (PV) systems for generating electric energy include a PV inverter which converts a DC voltage generated by a PV generator into an AC voltage which then can be fed for example into an energy supply system. Suitable inverters, in particular inverters with a bridge circuit consisting of semiconductor switches and associated control methods are generally known and described for example in DE 10 2005 024 465 B4.

Known inverter circuits with semiconductor bridges have been found in practice to be reliable in the feeding energy generated by means of photovoltaic systems into an energy supply system. However, the DC voltages present in an intermediate circuit at the DC voltage input of the inverter need to have at least the value of the peak amplitude of the energy supply system. Otherwise, the voltage is insufficient for generating the desired AC current or respectively the desired AC voltage. Consequently, the photovoltaic generators used need to provide a sufficiently high intermediate circuit voltage.

Existing installation regulations often permit only limited maximum voltages. In the U.S., for example, only PV systems are permitted to be installed whose voltages, as measured to ground, does not exceed 600V. This must be ensured in particular also during operating disturbances, for example, in case of a short circuit. Since operating disturbances during feeding of elective power into the power supply system can never be excluded, PV generators for the USA are generally so dimensioned that their idle voltage does not exceed 600V DC.

Even though different AC current or three phase current supply systems are used in the U.S. a normal three phase power supply system has a system voltage with an effective value of 3 AC 480 V. This results in the need for an intermediate circuit voltage at the input to the inverter of at least 800V DC for feeding the power unto the net. This intermediate circuit voltage must be generated normally by expensive and inefficient DC/DC voltage increasing devices in particular because of the regulations limiting the maximum voltages. The use of voltage increasing devices in an inverter circuit however results necessarily to a lower efficiency and an increase in the complexity of the PV system.

Another possibility to generate a higher AC voltage resides in transforming the AC at the exit of the inverter by means of a transformer to an AC voltage with higher amplitudes. Such a transformer however also causes relatively high losses and substantially reduces the efficiency of the photo voltaic system. There is in the US the tendency to use photovoltaic systems with inverters which do not require any transformers.

US 2009/0032082 A1 proposes to couple two PV generators in series when needed to provide with the maximum admissible generator voltage a higher intermediate circuit voltage. The PV system disclosed includes a first PV generator with a positive and a first neutral connection, a second PV generator with a negative and a second neutral connection, an inverter which is connected to the positive connection of the first PV generator and the negative connection of the second PV-generator and a remotely controlled circuit arrangement. The circuit arrangement includes a main switch which is closed to connect the first neutral connection of the first PV generator to the second neutral connection of the second PV generator when the two PV-generators supply power to the inverter, and which is opened for separating the two neutral connections from each other, when the two PV generators do not supply power to the inverter. The PV generators are each designed for a maximum idle voltage of 600 V DC, which, during operation provides for a maximum intermediate circuit voltage of 1200V DC without the use of a voltage increasing device. However, when at the neutral connections of the two PV-generators a potential corresponding to ground potential occurs the limitation of the system voltage to maximally +/−600 V DC is observed.

When the PV-generators do not supply any power to the inverter, for example, at night or a fault they are uncoupled by opening the main switch. For this case, the circuit arrangement includes further auxiliary switches which are provided to connect the neutral connections of the PV-generators in each case to a ground connection at the inverter. In this way, the two PV generators are isolated from each other and are grounded.

This configuration however is very complex in its setup and, additionally requires expenses for circuitry and a control of the operation. It requires three DC switches which used to be controlled to establish the two modes of operation with coupled and uncoupled generators. In addition conduits for the grounding of the neutral connections of the two generators via the auxiliary switches are required.

In addition also an isolation measurement with uncoupled PV-generators is more expensive. It is important to monitor the isolation at least before the connection of the inverter to the power supply and also driving operation. In this connection, it is generally known to input predetermined signals at the DC voltage side of the inverter and to evaluate the voltages or currents obtained as a reaction to those signals in order to determine anomalies. The configuration known from US 2009/0032082 two separate circuits which need to be maintained separately are present when, out of operation, the main switch is opened and the auxiliary switched are closed. Consequently for each circuit separate means must be provided for measuring the isolation and the isolation measurements must be performed independently of one another.

Based hereon it is the object of the present invention to eliminate the shortcomings of the state of the art or at least to reduce them and to develop a cost-effective and reliable arrangement for providing an input DC voltage for a photovoltaic inverter with which a reliable maximum generator voltage (of for example 600 V DC) against ground can be maintained in each operating state while still maintaining the advantages of higher intermediate circuit voltages above this limit value with regard to an efficient feeding of the power into the power supply. This is obtained with a simple design and low expenditures. Furthermore the arrangement should also facilitate a low-expenditure isolation measurement.

It is a further object of the present invention to provide a photovoltaic system with such a voltage providing arrangement and an associated operating method.

SUMMARY OF THE INVENTION

The present invention provides a photovoltaic system which includes a first and a second photovoltaic generator (9, 11) which delivers electric energy, an inverter (4) which can be coupled to the PV-generators (9, 11) for converting electric energy of the PV generators (9, 11) to output AC energy, and a switchable coupling arrangement (3) for coupling the PV generators (9, 11) to each other and to the inverter (4). The coupling arrangement (3) is arranged functionally between the PV generators (9, 11) and the inverter (4) and designed to connect the PV generators selectively either in a series circuit arrangement or a parallel circuit arrangement to the inverter (4). The PV system (1) can therefore expediently be operated with an intermediate circuit voltage which is higher than the maximum voltage of one PV generator for achieving improved efficiency whereas it can be switched to a lower intermediate circuit voltage when necessary, for example, in case of a ground connection fault, to maintain predetermined voltage limits.

In accordance with one aspect of the present invention, an arrangement according to the invention for providing an input DC voltage for a photovoltaic (PV) inverter, particularly a PV inverter without transformer, includes a first PV generator, a second PV generator and a switchable coupling arrangement for switching the two PV generators selectively to a series or a parallel circuit arrangement depending on the mode of operation. The first PV generator has a first connection for connection to a positive DC voltage input connection of the inverter and a second connection. The second PV generator has a first connection and a second connection, wherein the second connection with the negative DC input connection of the inverter. In accordance with the invention a switchable coupling arrangement is arranged and set up in such a way that it couples the first and the second photovoltaic generator selectively either in series or in effect in parallel.

In a first operating mode which is utilized preferably during the isolation measurement before connection to the power supply network or during an operating range of low power generation the coupling arrangement switches to a first state in which the two photovoltaic generators are effectively switched into a parallel arrangement. A limit voltage which is for example required by installation regulations is maintained in this first operating mode also with a floating generator (generator without ground connections). This operating mode may be called switching in or low load operation.

In a second operating mode which will herein be called normal operating mode the coupling arrangement assumes a second state in which it establishes a series connection of the two PV generators so that the sum of the two generator voltages is utilized as increased intermediate circuit voltage in order for example to increase the efficiency of the solar inverter. A maximum limit value for the operating voltage with respect to ground as it is often determined by installation regulations however is not exceeded. The PV generators each have a maximum idle-on operating voltage which maximally equals the permitted value. Furthermore, the inverter provides usually for a symmetry so that the potential of the connecting point between the two PV generators is about at ground level. In this way, it is ensured that the voltage at any location of the DC voltage side of the inverter with respect to ground has a value of not more than the admissible maximum value.

In this way, the arrangement according to the invention for providing an input DC voltage for a photovoltaic inverter makes it possible to operate the inverter with a higher intermediate circuit voltage and thereby increase the efficiency while ensuring a regulation-conforming operation of a PV inverter with respect to permissible maximum voltages. This is achieved with simple means and little expenditures essentially by the switchable coupling arrangement according to the invention.

The PV generators according to the invention are essentially identical that is they are designed for identical nominal currents, nominal voltages and identical maximal voltages. The PV generators may provide for example a maximum idle voltage of about 600 V DC and a maximum operating voltage under load of about 450 V DC in order to be suitable for installation in the USA. They are operated not grounded that is with floating potentials. They are therefore well suitable for use in connection with transformerless inverters and make it easily possible to perform an isolation measurement at the DC voltage side of the inverter since no disturbing eddy currents occur here because there is no ground connection.

The coupling arrangement according to the invention includes preferably a switching arrangement which is arranged between the second connection of the first photovoltaic generator and the first connection of the second photovoltaic generator in order to interconnect these connections in the closed state and separate them in the open state of the switching arrangement. With a suitable circuitry, it is ensured that in the open state of the coupling arrangement the PV generators are automatically places in parallel circuit relationship.

The switching arrangement of the couplings arrangement according to the invention includes preferably a controllable DC switch which permits the controlled switching on and off of a DC circuit. To suitable DC switches for this purpose in particular relays are well known in the art. Advantageously, only one such switch is required.

In order to permit a rapid switching between a series and a parallel circuit arrangement of the PV generators with a single switch, the coupling arrangement includes preferably two coupling paths which are each arranged between the first and second connections of the PV generators. In this way, a first coupling path is provided between the plus pole of the first PV generator and the plus pole of the second PV generator which a second coupling path is provided between the minus pole of the first PV generator and the minus pole of the second PV generator. The circuit expenditure herefor is minimal.

The coupling paths each includes a current rectifier element which prevents that short circuits can occur during a switch-over of the coupling arrangement according to the invention.

In a particularly preferred embodiment the current rectifier elements are formed by simple diodes. In this case, a first diode is arranged in the first coupling path in blocking direction as seen from the plus pole of the first to the plus pole of the second PV generators whereas a second diode is arranged in the second coupling path from the minus pole of the first to the minus pole of the second PV generator in blocking direction. The coupling paths with the diodes provide current paths and the connections needed for the parallel operation of the PV generators and prevent a short circuit during series operation of the PV generators. In the parallel circuit arrangement, the PV-generators are still galvanically interconnected which permits a common isolation measurement.

According to a further aspect of the present invention, a photovoltaic plant with an arrangement for generating an input DC voltage as described above and with an inverter is provided which, via DC input connections is connected to the input DC voltage generating arrangement and is designed to convert the input DC voltage into an AC voltage and to transfer it via the AC voltage output connections. The advantages of the voltage supply arrangement according to the invention, in particular, a high efficiency and a high reliability with high operational safety benefit the whole photovoltaic plant.

In a preferred application, the photovoltaic system according to the invention is used for supplying AC current to a power supply system, in particular a network with a low-frequency single- or three phase series-like AC voltage with a frequency of 50 or 60 Hz. The inverter is consequently a network-based preferably network guided transformer-free inverter. In a preferred embodiment, the inverter includes a semi-bridge or full bridge circuitry with semiconductor switches which are timed with very high frequency to generate at the output an AC current adapted to the network AC voltage. The photovoltaic system may be provided for supplying power either to a three-phase current according to a North American system, in particular, a system with an effective value of the AC voltage of 3 AC 480 volt, even if the PV generators are designed each for maximally 500 or, respectively, 600 V DC.

Advantageously, the configuration according to the invention facilitates also a faster "waking" of the system at day break. With the parallel circuit arrangement of the two PV-generators current is then supplied by both generators. The lower current generation of a PV generator at day break is partially compensated for.

Preferably a control arrangement is provided which controls the operation of the voltage supply arrangement according to the invention, in particular, the switching of the coupling arrangement as well as the operation of the inverter, especially the timing of the inverter switching elements.

The control arrangement is preferably connected with an evaluation arrangement which is designed to detect faulty operating conditions such as ground connections short circuits, error currents etc. and to advise the control arrangement of such conditions. If such conditions can not be determined the control arrangement causes a switch-over of the coupling arrangement to a series arrangement of the PV generator. In the state of rest, for example, before connection to the power supply system or at night and also during a disturbance, the PV generators are switched parallel to each other.

In accordance with a further aspect of the invention, a method for operating a PV system for generating an AC voltage from a DC voltage of a photovoltaic generator by means of an inverter is provided. The method comprises the step of providing two PV generators of essentially the same design and the connection of in each case one connection of each PV generator to a connection of the inverter. The method further comprises connecting the other connections of the PV generators with one another so as to form a series circuit of the PV generators and supplying the added voltage of the two PV generators as increased input DC voltage during normal operation to the DC voltage intermediate circuit of the inverter.

The method according to the invention further provides that in a modified operation, that is for example during disturbances or in the state of rest, for example, before switching to the power supply system, at night or at a time of low power generation, the two voltaic generators are switched to a parallel arrangement and then only the reduced system voltage of a single generator supplies voltage to the inverter. In every operating mode, the predetermined maximal voltages are observed.

BRIEF DESCRIPTION OF THE DRAWINGS

Further features and advantageous embodiments of the invention are apparent from the drawings of the exemplary embodiments of the invention; they should not be considered to be limitations. In the figures identical components are provided with the same reference numerals. It is shown in.

DETAILED DESCRIPTION OF VARIOUS EMBODIMENTS

Figure 1:
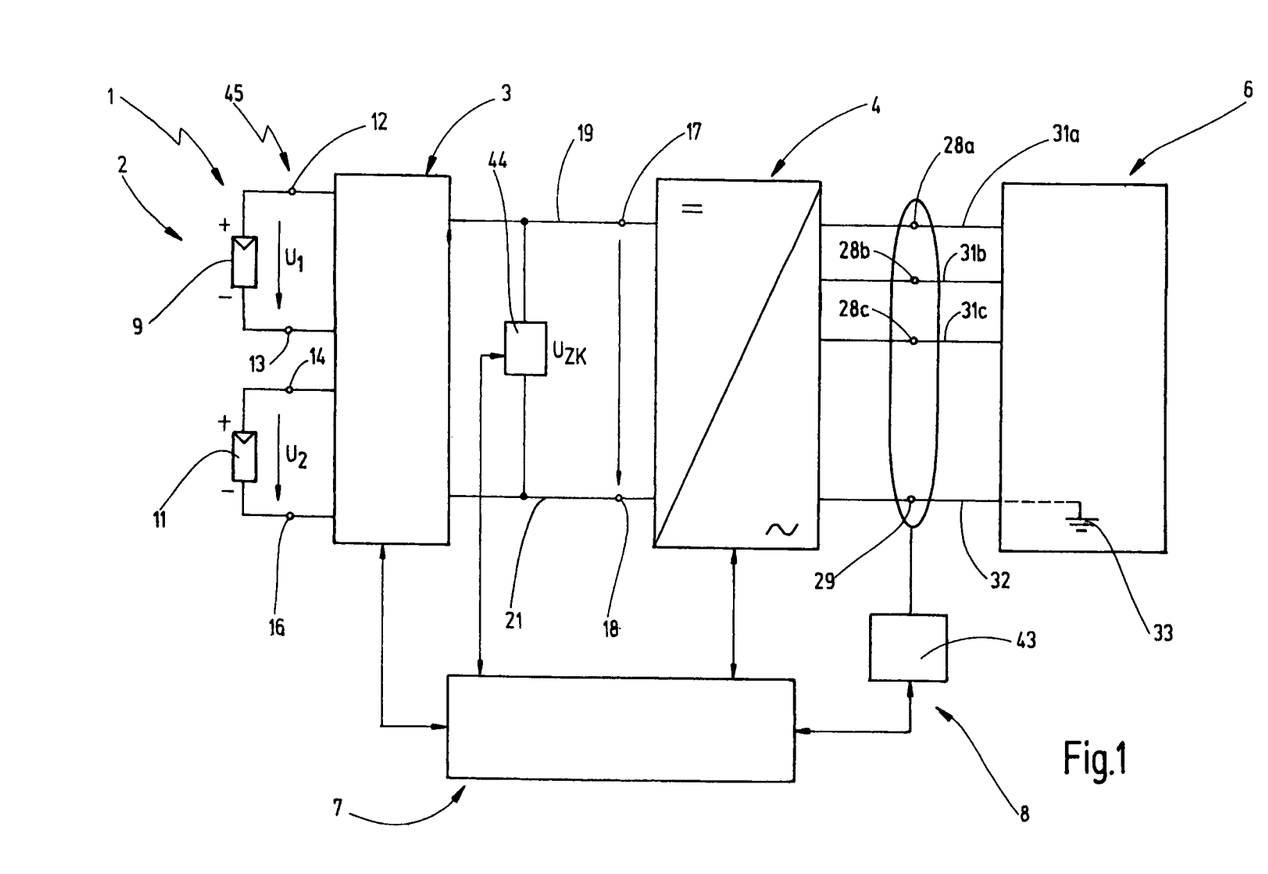
FIG. 1 is a schematic representation of a photovoltaic system with two photovoltaic generators and a coupling arrangement for an operating mode-dependent coupling of the photovoltaic generators according to the invention.

FIG. 1 shows a photovoltaic system (PV-system) 1 for the conversion of solar radiation to electric energy. The PV system 1 includes a PV generator arrangement 2 which is connected via a coupling arrangement 3 to an inverter 4, which as shown herein is connected to an external energy supply system 6 and which is adapted to supply an AC current to the power supply system 6. Furthermore, FIG. 1 shows a control arrangement 7 which controls the operation of the PV system 1 and a supervisory unit 8 which supervises the operating modes of the PV system 1. These devices are described further below in greater detail.

The configurations shown in FIG. 1 and in the other figures are only of exemplary nature and shown in part only schematically in the form of functional blocks which are intended to represent the various functions of the elements of the PV system without implying any assignment of functions to a special hardware or software. Consequently, the individually shown functional blocks may be implemented separately or integrated with others either with regard to hardware and/or software or firmware.

The PV generator arrangement 2 includes in the present case a first PV generator 9 and a second PV generator 11 which are of essentially identical design that is they have the same nominal size and voltages. The first PV generator 9 includes a first terminal 12 extending from its plus pole and a second terminal 13 extending from its minus pole. In the same way, the second PV generator 11 includes first and second terminals 14 and 16 extending from its plus and, respectively, minus poles. Between the terminals 12, 13 and, respectively, 14, 16 the respective generator voltages $U_1$, and, respectively, $U_2$ are present in the form of DC voltages. These voltages are essentially the same during operation but they may well be different because of shading effects.

The coupling arrangement 3 couples the PV generator arrangement 2 to the inverter 4 in a switchable manner. In particular, the coupling arrangement 3 connects the first connection 12 of the first PV generator 9 firmly to a first positive DC voltage input terminal 17 and the second connection 16 of the second PV generator 11 to a second negative DC voltage input terminal 18 of the inverter 4. As a result, at the inverter input a DC voltage is provided between the terminals 17, 18 which is also called intermediate circuit voltage $U_{ZK}$.

Figure 2:
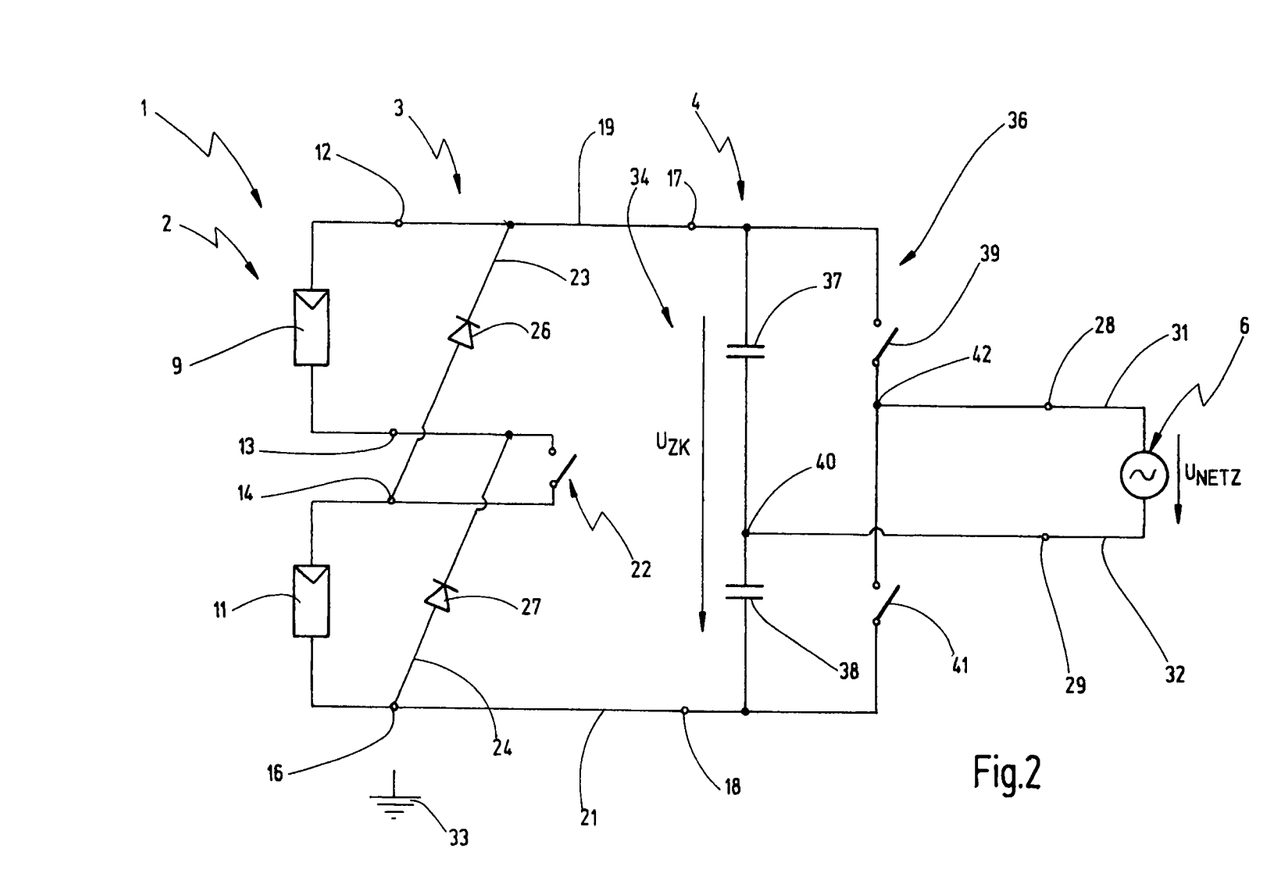
FIG. 2 is a schematic representation of a coupling arrangement according to the invention for coupling the two photovoltaic generators of the photovoltaic system of FIG. 1 according to one embodiment of the invention in greater detail.

A preferred realization of the coupling arrangement 3 according to the invention is shown in FIG. 2 with enlarged components. The coupling arrangement 3 includes a first DC voltage branch 19 which connects the positive connection 12 of the first PV generator 9 firmly to the terminal 17 of the inverter 4, and a second DC branch 21 which connects the negative terminal 16 of the second PV generator 11 firmly to the terminal 18 of the inverter 4. If needed, the DC voltage branches 19, 21 may also include separating switches (not shown) which for example during a strong disturbance facilitate a complete electrical isolation of the inverter 4 from the PV generator arrangement 2.

The coupling arrangement 3 further includes a switching arrangement 22 for switching the first PV-generator 9 in series with the second PV generator 11 when necessary, as well as two coupling paths 23, 24 which provide for a parallel circuit arrangement of the PV generators 9, 11 when needed. The switching arrangement 22 is in the form of a controllably switchable DC switch, which is disposed between the second terminal 13 of the first PV-generator 9 and the first terminal 14 of the second PV generator 11 in such a way that, in its normally closed state it interconnects the terminals 13, 14 and separates them from each other in its open state. Suitable DC switches, in particular, relays as they are needed for the switching of DC currents of the level as they are provided by photovoltaic generators are known in the art.

The coupling paths 23, 24 extend in each case between same pole terminals 12, 14 or respectively 13, 16 of the first and second PV generators 9, 11. Expressed more accurately the first coupling path 23 interconnects the first connection 12 of the first PC generator 9 and the first connection 14 of the second PV generator 11 whereas the second coupling path 24 interconnects the second terminals 13 and 16 of the PV generators 9, 11. Each coupling path 23, 24 includes an inverter element which here is in each case in the form of a simple diode 26 or, respectively 27. The diodes 26, 27 are arranged in the coupling paths 23, 24 in case in the flow direction from the second PV generator 11 to the first PV generator 9. As current flow control elements also thynistors, transistors switched as diodes or switches etc. may be used which permit current flow only in one direction although diodes are preferred because of their simplicity and reliability.

Again referring to FIG. 1, it is apparent that the inverter 4 with its input DC terminals 17, 18 is connected to the PV-generator arrangement 2 in order to receive DC energy therefrom whereas it is connected via its output connections 28, 29 to the power supply system 6, for example to a low voltage power supply with an AC frequency of 50 or 60 $H_z$ in order to supply AC power to the power supply system. The connections 28, 29 define the AC voltage power supply output.

FIG. 1 shows a configuration wherein the power supply system is a three-phase current supply system and the inverter 4 is in the three-phase configuration. The inverter therefore has three AC voltages connections 28a, 28b, 28c which are connected via conductors 31a, 31b, 31c to associated power supply system connections, and an AC voltage connection 29 which serves as neutral connection and which is connected to the power supply system by a neutral line 32. At the power supply system side the neutral line 32 is preferably connected to a protective conductor and, as a result, grounded as it is shown in FIG. 1 by a corresponding ground symbol 33.

The three-phase configuration according to FIG. 1 is only of exemplary nature and not limiting. The invention is also useable in connection with single-phase AC power supply systems and inverters. It is however important that the inverter is a transformerless inverter, that is, that it is connected directly to the power supply system 6 without a transformer. Since there are no transformer losses, the transformer free configuration provides the basis for a high efficiency. This makes it also possible to operate the PV generator arrangement 2 with floating potentials that is without grounding.

FIG. 2 shows in a highly schematic form an exemplary, by no means limiting, embodiment of an inverter 4 which for simplicity reason, is shown here in a single-phase configuration. The inverter 4 includes an intermediate circuit 34 and an inverter circuit 36 in the form of a semi-bridge. The intermediate circuit 34 is connected to the input DC voltage connections 17, 18 and serves as an interim store for the energy supplied by the PV generator arrangement 2 which energy is then converted by the semi-bridge circuit 36 to AC current. The intermediate circuit is here in the form of a series-circuit of two buffer capacitors 37, 38 which are essentially identical. The connecting point 40 between the two capacitors 37, 38 is connected to the neutral connection 29.

The inverter circuit 36 herein is in the form of a semi-bridge with two serially connected semiconductor switches 39, 41 which are switchable at high frequencies of up to 100 kHZ. Preferably low-loss IGBT (insulated gate bipolar transistor—or MOS (metal oxide semiconductor) field effect transistor switches are used herein although also other types of switches may be used. The connecting point 42 between the switch elements 39, 41 serves as center connection for the AC voltage generated by the inverter circuit 36 and is connected to AC voltage connection 28.

It is to be noted that the representation according to FIG. 2 is highly simplified and that numerous elements which are conventionally used in such inverter systems are omitted because they are not particularly relevant for the invention. For example, the connecting lines 31, 32 to the external power supply system 6 may include at least one energy store such as a storage throttle L and possibly further filter elements for example for suppressing high-frequency voltage components.

Again referring to FIG. 1, the control arrangement is shown in the form of a single function block 7 which has the purpose to control the operation of the PV-system 1. The control arrangement 7 may also structurally be composed of different dedicated units which perform a particular function and are in communication with one another. It can be realized with hardware and/or software and/or firmware or in another way. For the present invention, it is in particular important that the control arrangement 7 switches during operation the coupling arrangement 3 in a suitable manner for coupling the PV generator arrangement 2 in different ways to the inverter 4 and controls the inverter 4 so as to generate a desired AC supply.

For controlling the operation the control arrangement 7 is further connected to a supervising unit 8 which supervises the state of the PV-system 1 in particular with respect to fault conditions. FIG. 1 shows the preferred embodiment wherein the supervising unit 8 includes AC voltage-side monitoring means 43 and DC voltage-side monitoring means 44. The AC voltage-side monitoring means 43 monitors, for example, fault currents on the AC voltage side of the inverter 4. In case of a three-phase power supply system, for example, the supply currents may be monitored as a summarized current of all power supply system conductors which ideally should be zero. As a result, a fault condition may be detected when the strength of the output currents over a predetermined period exceeds predetermined limits.

The monitoring means 44 are designed to detect conditions, in particular fault conditions on the DC voltage side. The monitoring means 44 can detect for example ground circuits at all connections or respectively conductors 13, 14, 19, 21, 23, 24 connected to the PV-generators. Various methods are known herefor. The monitoring means may for example apply current or voltage signals to the conductors 19, 20 and measure the reaction of the DC voltage-side circuit section of the inverter 4.

Figure 3:
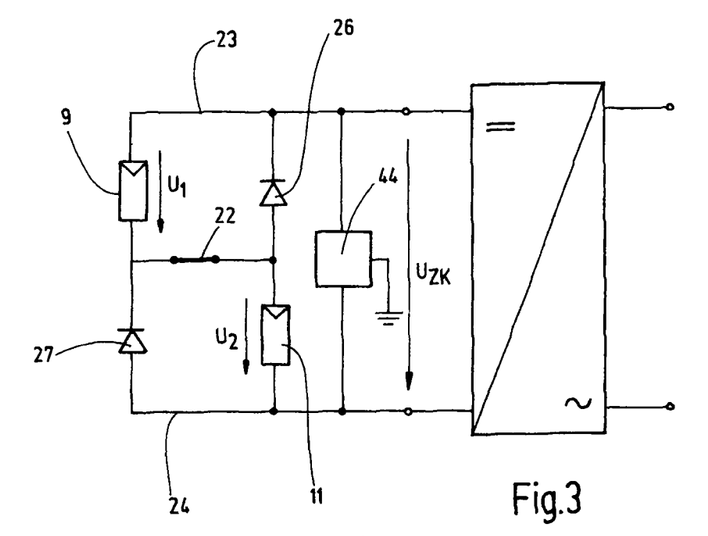
FIG. 3 is a schematic representation of the photovoltaic system according to the invention of FIGS. 1 and 2 in a normal operating mode.
Figure 4:
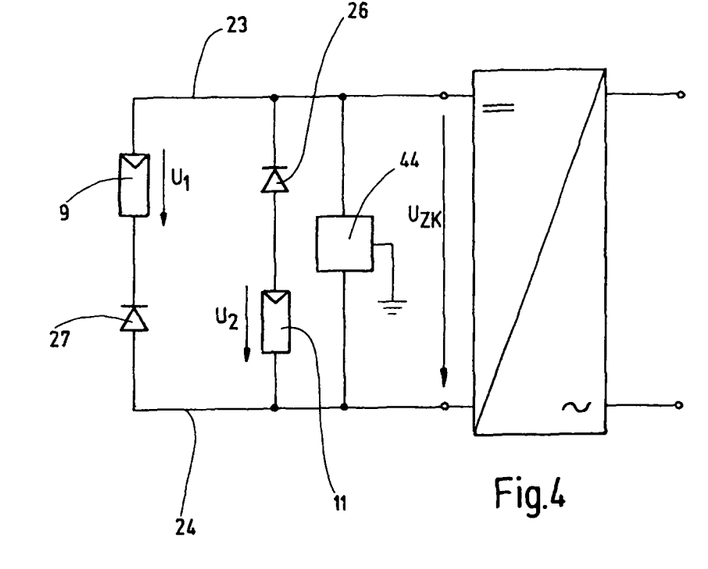
FIG. 4 is the photovoltaic system according to the invention of FIGS. 1 and 2 in a low-power operating mode in a highly schematic representation.

The operation of the PV-system 1 according to the invention will be described below in connection with FIGS. 3 and 4. FIG. 3 shows a circuit arrangement like that shown in FIG. 2 when the switch arrangement 22 of the coupling arrangement 3 is in a closed state. FIG. 4 shows the respective circuit arrangement for the case that the switch arrangement 22 is open.

The PV-system 1 has the purpose to convert the DC voltage produced by the generator arrangement 2 into AC current for supplying it to the power supply system 6. It is suitable in particular for operation in countries in which installation requirements limit the maximum voltages of the system. In the USA, for example, in PV-systems, voltages on the PV generator and the conduits connected thereto must never exceed 600 volts against ground. However, a three-phase power supply system in the US has a power supply AC voltage with the effective value of 480V, which, for supplying power to the power supply system, requires an intermediate circuit voltage of at least 750V and up to 1000V. The present invention facilitates such an increased intermediate circuit voltage for achieving higher efficiency while complying with the installation regulations regarding maximum voltages. The invention avoids the use of expensive and high-loss DC/DC step-up converter at the DC voltage side. It also avoids the use of transformers on the AC voltage side which would cause losses.

The invention complies with the requirements by providing a suitable intermediate circuit voltage at the input to the PV-inverter 4 by means of an arrangement 46 including the two PV generators 9, 11 and the switchable coupling arrangement 3. The PV generators 9, 11 are essentially identical and have for example a maximum idle voltages of 600V and a maximum operating voltage under load of 500V. As apparent from the figures, the generators are not grounded and, with the switching arrangement 22 of the coupling arrangement 3 advantageously, galvanically interconnected.

When the PV-system 1 is switched on, either by the rising sun or in another way, the switching arrangement 22 is first in the open-state as it is shown in FIG. 4. The two PV generators 9, 11 are switched by the two diodes 26, 27 in the coupling paths 23, 24 in a parallel circuit arrangement. The inverter 4 is supplied with the maximum operating voltage of 500V (or, respectively the maximum idle voltage of 600 under idling conditions). The diode 27 connects the minus pole of the first PV generators 9 with the minus pole of the second generator 11, whereas the second diode connects the plus pole of the second generator 11 with the plus pole of the first generator 9. Since the two PV generators 9, 11 supply power to the inverter 4, the usual current drop at day break can be avoided or at least substantially suppressed which increases the efficiency. A fast "awakening" of the PV system is achieved thereby.

The monitoring arrangement 8 now performs via the DC voltage-side monitoring means 44 an isolation measurement in order to examine the conditions of the DC voltage side. If the isolation measurement was successful that is if no ground connection or similar was found, and if further conditions for switching to the power supply system are fulfilled, the control arrangement 7 causes a switch-over of the switch 22 to the closed state. As a result, the two PV-generators 9, 11 are switched in series via the switch 22 and inverter 4 feeds the AC energy into the power supply system. The switch 22 connects the minus pole of the first generator 9 to the plus pole of the second PV-generator 11 and the diodes 26, 27 prevent a short circuit of the generators. This state is shown in FIG. 3.

Because of the grounding 33 of the neutral conductor 32 and the symmetrical arrangement of the inverter 4, the potential of the center area 13, 14 between the two PV-generators is, with the switch 22 closed, at the level of the neutral conductor or, respectively, ground potential. This is called virtual ground. It is therefore ensured that the voltage with respect to the ground potential is nowhere greater than the maximum operating voltage of 500V (or respectively the maximum idle voltage of 600V). Consequently, the respective installation regulations are observed. At the intermediate circuit 34, however, all together an intermediate circuit voltage $U_{ZK}$ is present via the buffer condensers 37, 38 which corresponds to the sum of the two PV-generators voltages $U_1$ and $U_2$ which as a result is up to 1000V (or respectively 1200V). This increased voltage facilitates an efficient feeding of the electricity into the power supply system, specifically into the 3AC 480V three phase power supply system common in the US.

In the normal operating state wherein the PV generators 9, 11 are in a series circuits arrangement, mainly the AC voltage-side monitoring means 43 monitor possible isolation errors by performing a fault current measurement. If an isolation error is detected the inverter enters the modified or respectively error operation mode in that the control arrangement 7 opens again the switch 22 automatically in order to switch the PV-generators again parallel to each other the intermediate circuit voltage then is maximally again 500V so that the maximum limits are maintained.

Overall the invention makes it possible to operate the PV-system at higher intermediate circuit voltages which results in a higher output energy with better efficiency, while adhering to the regulations concerning maximum system voltages limits. This is achieved with simple means and low expenditures. The coupling arrangement according to the invention which requires only one switch 22 and two coupling paths 23, 24 each with a diode 26, 27 represents a particularly simple realization for fulfilling the requirements described above. The simple realization also forms the basis for a reliable self-sufficient operating mode: For example, even with the switch 22 becoming defective, the system switches automatically switched into the second operating mode wherein the two PV generators 9, 11 are in a parallel circuit. Preferably in this operating state, the isolation measurement based on the monitoring means 44 occurs at a voltage of less than 600 volts. In addition, the invention brings the further advantage of the early wakening of the PV system and increased efficiency resulting therefrom.

With the selective switch over between the series and the parallel circuit arrangement of the PV-generators 9, 11 in connection with the use of a transformerless inverter 4 a grounding of the PV generators 9, 11 is not necessary. As a result, the wiring requirements are reduced so that a simple isolation measurement at the DC voltage side can be performed.

Figure 5:
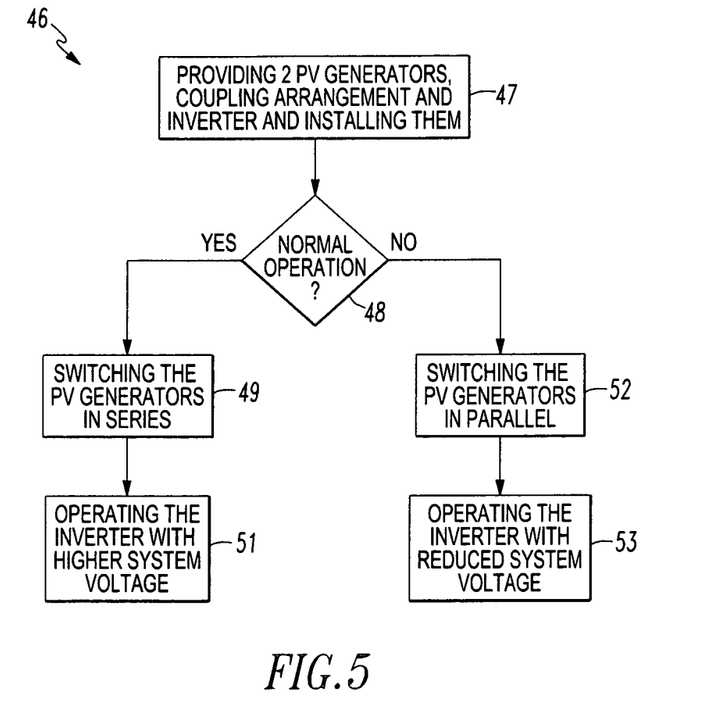
FIG. 5 is a flow diagram representing a method according to the invention for operating a photovoltaic system in a simplified representation.

FIG. 5 shows a flow diagram which represents a method 46 for operating a photovoltaic system, for example a PV system 1 as shown in FIGS. 1-4 for generating an AC voltage from a DC voltage of a photovoltaic generator by means of an inverter. In step 47 two essentially identical PV generators are provided, wherein in each case one of the connections of each PV-generator is connected with a connection of the inverter. Furthermore, a coupling arrangement for coupling of the other connections of the PV generators is provided.

In step 48, it is determined whether there is a normal operation. This may include an isolation measurement in the PV system for detecting ground connections or other faults.

If normal operation is determined, the two PV generators are connected in step 49 in series with each other, and the sum of the two generator voltages is supplied to the inverter input as intermediate circuit voltage. The inverter then generates in step 50 an output current which for example, but not necessarily, is supplied to the power supply system.

If it is determined in step 48 that no normal operation is present, for example, when the PV-system is in the state of awakening or the operation is faulty the PV generators are switched in step 52 parallel to each other and the inverter 53 is operated at the reduced voltage which corresponds to the voltage generated by a single generator or is shut down.

A photovoltaic system includes a first and a second photovoltaic generator 9, 11, which provide electric energy, an inverter 4 which can be coupled to the PV generators 9, 11 for converting the electric energy of the PV generators 9, 11 into output AC energy and a switchable coupling arrangement 3 for coupling the PC generators 9, 11 together and with the inverter 4. The coupling arrangement 3 is arranged functionally between the PV generators 9, 11 and the inverter 4 and designed to couple the PV generators 9, 11 to the inverter 4 selectively in a series or a parallel circuit arrangement to the converter input. The PV-system 1 can consequently be operated with a higher intermediate circuit voltage than the maximum voltage of one PV-generator in order to achieve a better efficiency but, when necessary, it can be switched to a lower intermediate voltage for example when in case of ground connection voltage limits have to be maintained.

What is claimed is:

1. Apparatus for providing an input DC voltage for a photovoltaic inverter (4), comprising:
    a first photovoltaic generator (9) including a first terminal (12) for connection to a positive DC input terminal (17) of the inverter (4) and a second terminal (13);
    a second photovoltaic generator (11) including a first terminal (14) and a second terminal (16) for connection to a negative DC voltage input terminal (18) of the inverter (4); and,
    an electronically switchable coupling arrangement means (3) for coupling the first and the second photovoltaic generators (9, 11) selectively to be effectively in a series circuit or in a parallel circuit arrangement; and,
    a control arrangement (7) for controlling the operation of the inverter and of the electronically switchable coupling arrangement means (3).

2. Apparatus according to claim 1, wherein the photovoltaic generators (9, 11) have a maximum idle voltage of about 600V and a maximum operating voltage of about 450V.

3. Apparatus according to claim 1, wherein the electronically switchable coupling arrangement means (3) includes a switching arrangement (22) which, in a closed state, interconnects the second terminal (13) of the first photovoltaic generator (9) and the first terminal (14) of the second photovoltaic generator (11).

4. Apparatus according to claim 3, wherein the electronically switchable coupling arrangement means (3) includes a controllable DC switch.

5. Apparatus according to claim 1, wherein the electronically switchable coupling arrangement means (3) includes two coupling paths (23, 24), which are arranged between the first terminals (12, 14) and respectively, the second terminals (13, 16) of the photovoltaic generators (9, 11).

6. Apparatus according to claim 5, wherein the coupling paths (23, 24) include each a current rectifier element (26, 27).

7. Apparatus according to claim 6, wherein the current rectifier elements comprise diodes (26, 27) which are arranged in each case in blocking direction between the first terminal (12) and, respectively the second terminal (13) of the first photovoltaic generator (9) and the first terminal (14) or, respectively the second terminal (16) of the second photovoltaic generator (11).

8. Apparatus according to claim 1, wherein the photovoltaic generators (9, 11) are not grounded and, in the parallel circuit arrangement switched state galvanically interconnected.

9. Photovoltaic system (1) for generating AC current by photovoltaic processes, including:
    an arrangement 45) for providing an input DC voltage for a photovoltaic inverter (4), including a first photovoltaic generator (9) including a first terminal (12) for connection to a positive DC input terminal (17) of the inverter (4) and a second terminal (13), a second photovoltaic generator (11) including a first terminal (14) and a second terminal (16) for connection to a negative DC voltage input terminal (18) of the inverter (4), and, an electronically switchable coupling arrangement means (3) for coupling the first and the second photovoltaic generators (9, 11) selectively to be effectively in a series circuit or in a parallel circuit arrangement,
    a control arrangement (7) for controlling the operation of the inverter and of the electronically switchable coupling arrangement means (3); and,
    the inverter (4) connected in circuit via DC input terminals (17, 18) to the arrangement (45) and the inverter (4) for converting an input DC voltage ($U_{ZK}$) to an AC voltage $U_{NETZ}$ and to supply the AC voltage $U_{NETZ}$ to an AC voltage output terminal (28, 29) thereof.

10. Photovoltaic system according to claim 9, wherein the inverter (4) is a power supply-connected transformerless inverter including semiconductor switching elements, and the AC voltage is a low frequency power supply voltage with an AC frequency of 50 $H_Z$ or 60 $H_Z$.

11. Photovoltaic system according to claim 9, further including a monitoring arrangement (8) for detecting a state of faulty operation and reporting it to the control arrangement (7) and that the control arrangement (7) then initiates switching of the electronically switchable coupling arrangement means (3) to establish operation of the photovoltaic generators (9, 11) in the parallel circuit arrangement.

12. Photovoltaic system according to claim 11, wherein the monitoring arrangement (8) includes means (43) for detecting faulty operation on the DC voltage side and means (44) for detecting faulty operation on the AC voltage side of the inverter (4).

13. Apparatus according to claim 1, further including a monitoring arrangement (8) for detecting a state of faulty operation and reporting it to the control arrangement (7) and that the control arrangement (7) then initiates switching of the electronically switchable coupling arrangement means (3) to establish operation of the photovoltaic generators (9, 11) in the parallel circuit arrangement.

14. Method for generating an AC voltage from a DC voltage of a photovoltaic generator by means of an inverter, comprising the steps of:
    providing two photovoltaic generators and connecting in each case one terminal of each photovoltaic generator to a terminal of the inverter (47);
    interconnecting the other terminals of the photovoltaic generators to provide a series circuit arrangement of the photovoltaic generators (41) and applying the summarized voltage of the two photovoltaic generators to the input terminal of the inverter (51) during normal operation; and, coupling the photovoltaic generators effectively in a parallel circuit relationship (52), for applying a reduced input voltage corresponding to the voltage of one photovoltaic generator to the inverter (53) during a modified mode of operation.

\* \* \* \* \*